(12) United States Patent
Joharapurkar et al.

(10) Patent No.: US 9,391,607 B2
(45) Date of Patent: Jul. 12, 2016

(54) USE OF RANDOM SAMPLING TECHNIQUE TO REDUCE FINGER-COUPLED NOISE

(75) Inventors: Ashutosh Ravindra Joharapurkar, Bangalore (IN); Patrick Chan, Sunnyvale, CA (US); David L. Allen, Sunnyvale, CA (US); Natarajan Viswanathan, Sunnyvale, CA (US)

(73) Assignee: QUALCOMM Technologies, Inc., San Diego, CA (US)

( * ) Notice: Subject to any disclaimer, the term of this patent is extended or adjusted under 35 U.S.C. 154(b) by 423 days.

(21) Appl. No.: 12/987,008

(22) Filed: Jan. 7, 2011

(65) Prior Publication Data

US 2011/0261008 A1 Oct. 27, 2011

Related U.S. Application Data

(60) Provisional application No. 61/326,830, filed on Apr. 22, 2010.

(51) Int. Cl.
*G06F 3/044* (2006.01)
*H03K 17/96* (2006.01)
*G06F 3/041* (2006.01)

(52) U.S. Cl.
CPC ............... *H03K 17/96* (2013.01); *G06F 3/044* (2013.01); *G06F 3/0418* (2013.01); *H03K 2217/96062* (2013.01)

(58) Field of Classification Search
None
See application file for complete search history.

(56) References Cited

U.S. PATENT DOCUMENTS

| 4,277,784 A | * | 7/1981 | Hyltin ............................. 345/87 |
| 4,477,834 A | * | 10/1984 | Beaumont et al. ............ 348/164 |
| 4,527,096 A | | 7/1985 | Kindlmann |
| 5,168,153 A | | 12/1992 | Ikeda |

(Continued)

FOREIGN PATENT DOCUMENTS

| CN | 1189719 A | 8/1998 |
| CN | 1942853 B | 4/2007 |

(Continued)

OTHER PUBLICATIONS

Internationl Search Report dated Dec. 3, 2009, PCT Patent Application Serial No. PCT/US 09/61359, Filed Oct. 20, 2009, Maxim Integrated Products, Inc.

(Continued)

*Primary Examiner* — Antonio Xavier
(74) *Attorney, Agent, or Firm* — Weaver Austin Villeneuve & Sampson LLP

(57) ABSTRACT

Random sampling techniques include techniques for reducing or eliminating errors in the output of capacitive sensor arrays such as touch panels. The channels of the touch panel are periodically sampled to determine the presence of one or more touch events. Each channel is individually sampled in a round robin fashion, referred to as a sampling cycle. During each sampling cycle, all channels are sampled once. Multiple sampling cycles are performed such that each channel is sampled multiple times. Random sampling techniques are used to sample each of the channels. One random sampling technique randomizes a starting channel in each sampling cycle. Another random sampling technique randomizes the selection of all channels in each sampling cycle. Yet another random sampling technique randomizes the sampling cycle delay period between each sampling cycle. Still another random sampling technique randomizes the channel delay period between sampling each channel.

11 Claims, 6 Drawing Sheets

(56) References Cited

U.S. PATENT DOCUMENTS

| | | | |
|---|---|---|---|
| 5,313,141 A | 5/1994 | Kimball | |
| 5,444,459 A * | 8/1995 | Moriyasu | 345/440.1 |
| 5,463,283 A | 10/1995 | Sanderson | |
| 5,463,388 A | 10/1995 | Boie et al. | |
| 5,789,870 A | 8/1998 | Remson | |
| 6,075,520 A | 6/2000 | Inoue et al. | |
| 6,466,036 B1 * | 10/2002 | Philipp | 324/678 |
| 6,744,426 B1 * | 6/2004 | Okamoto et al. | 345/179 |
| 6,847,354 B2 * | 1/2005 | Vranish | 345/173 |
| 6,937,124 B1 | 8/2005 | Nakamura et al. | |
| 7,061,327 B2 | 6/2006 | Doy | |
| 7,176,753 B2 | 2/2007 | Noda et al. | |
| 7,283,120 B2 | 10/2007 | Grant | |
| 7,667,371 B2 | 2/2010 | Sadler et al. | |
| 8,054,299 B2 * | 11/2011 | Krah | 345/174 |
| 8,493,356 B2 | 7/2013 | Joharapurkar et al. | |
| 8,576,189 B1 * | 11/2013 | Maharyta et al. | 345/173 |
| 8,599,167 B2 | 12/2013 | Joharapurkar et al. | |
| 8,624,870 B2 | 1/2014 | Joharapurkar et al. | |
| 8,830,207 B1 | 9/2014 | Joharapurkar et al. | |
| 2002/0011991 A1 | 1/2002 | Iwasaki et al. | |
| 2002/0149561 A1 | 10/2002 | Fukumoto et al. | |
| 2003/0067449 A1 | 4/2003 | Yoshikawa et al. | |
| 2003/0174121 A1 | 9/2003 | Poupyrev et al. | |
| 2006/0064626 A1 * | 3/2006 | Fischer et al. | 714/776 |
| 2006/0092177 A1 * | 5/2006 | Blasko | 345/619 |
| 2006/0097991 A1 | 5/2006 | Hotelling et al. | |
| 2006/0119586 A1 | 6/2006 | Grant et al. | |
| 2007/0074913 A1 | 4/2007 | Geaghan et al. | |
| 2007/0080951 A1 | 4/2007 | Maruyama et al. | |
| 2007/0268272 A1 | 11/2007 | Perski et al. | |
| 2008/0007247 A1 * | 1/2008 | Gervais et al. | 324/76.38 |
| 2008/0041640 A1 * | 2/2008 | Gillespie et al. | 178/18.01 |
| 2008/0055277 A1 | 3/2008 | Takenaka et al. | |
| 2008/0062145 A1 | 3/2008 | Shahoian et al. | |
| 2008/0062147 A1 | 3/2008 | Hotelling et al. | |
| 2008/0143313 A1 * | 6/2008 | Tang et al. | 323/299 |
| 2008/0158169 A1 * | 7/2008 | O'Connor et al. | 345/173 |
| 2008/0158176 A1 | 7/2008 | Land et al. | |
| 2008/0158182 A1 | 7/2008 | Westerman | |
| 2008/0161946 A1 * | 7/2008 | Kubota et al. | 700/90 |
| 2008/0162996 A1 * | 7/2008 | Krah et al. | 714/27 |
| 2008/0162997 A1 * | 7/2008 | Vu et al. | 714/27 |
| 2008/0309627 A1 * | 12/2008 | Hotelling et al. | 345/173 |
| 2009/0009486 A1 | 1/2009 | Sato et al. | |
| 2009/0032312 A1 | 2/2009 | Huang et al. | |
| 2009/0055580 A1 * | 2/2009 | Moscibroda et al. | 711/104 |
| 2009/0096890 A1 * | 4/2009 | Li | 348/229.1 |
| 2009/0127003 A1 | 5/2009 | Geaghan | |
| 2009/0153152 A1 | 6/2009 | Maharyta et al. | |
| 2009/0167326 A1 * | 7/2009 | Geaghan | 324/678 |
| 2009/0167704 A1 | 7/2009 | Terlizzi et al. | |
| 2009/0174416 A1 * | 7/2009 | Ely et al. | 324/678 |
| 2009/0198907 A1 * | 8/2009 | Speight et al. | 711/137 |
| 2009/0284495 A1 * | 11/2009 | Geaghan et al. | 345/174 |
| 2010/0073323 A1 * | 3/2010 | Geaghan | 345/174 |
| 2010/0079383 A1 * | 4/2010 | Suggs | 345/173 |
| 2010/0141408 A1 | 6/2010 | Doy et al. | |
| 2010/0144391 A1 * | 6/2010 | Chang et al. | 455/566 |
| 2010/0156818 A1 | 6/2010 | Burrough et al. | |
| 2010/0156823 A1 | 6/2010 | Paleczny et al. | |
| 2010/0188356 A1 * | 7/2010 | Vu et al. | 345/173 |
| 2010/0214259 A1 * | 8/2010 | Philipp et al. | 345/174 |
| 2010/0245286 A1 | 9/2010 | Parker | |
| 2010/0277351 A1 * | 11/2010 | Taylor et al. | 341/33 |
| 2010/0302198 A1 * | 12/2010 | Tasher et al. | 345/173 |
| 2010/0308838 A1 | 12/2010 | Lee et al. | |
| 2011/0025629 A1 | 2/2011 | Grivna et al. | |
| 2011/0037705 A1 * | 2/2011 | Yilmaz | 345/173 |
| 2011/0061949 A1 | 3/2011 | Krah et al. | |
| 2011/0084936 A1 | 4/2011 | Chang et al. | |
| 2011/0128250 A1 | 6/2011 | Murphy et al. | |
| 2011/0156839 A1 | 6/2011 | Martin et al. | |
| 2011/0157069 A1 * | 6/2011 | Zhuang et al. | 345/174 |
| 2011/0157438 A1 * | 6/2011 | Compton et al. | 348/294 |
| 2011/0175835 A1 | 7/2011 | Wang | |
| 2011/0248930 A1 | 10/2011 | Kwok et al. | |
| 2011/0248931 A1 | 10/2011 | Shenfield et al. | |
| 2011/0260990 A1 | 10/2011 | Ali et al. | |
| 2011/0261005 A1 | 10/2011 | Joharapurkar et al. | |
| 2011/0261006 A1 | 10/2011 | Joharapurkar et al. | |
| 2011/0261007 A1 | 10/2011 | Joharapurkar et al. | |
| 2011/0261008 A1 | 10/2011 | Joharapurkar et al. | |
| 2012/0043976 A1 | 2/2012 | Bokma et al. | |
| 2012/0050213 A1 * | 3/2012 | Bokma | 345/174 |
| 2012/0113047 A1 | 5/2012 | Hanauer et al. | |

FOREIGN PATENT DOCUMENTS

| | | |
|---|---|---|
| CN | 200921485 A | 5/2009 |
| CN | 101634924 A | 1/2010 |
| CN | 101673155 A | 3/2010 |
| CN | 101714036 A | 5/2010 |
| CN | 101840293 A | 9/2010 |
| TW | 200702997 A | 4/2007 |
| TW | 200712997 | 4/2007 |
| TW | 200905538 A | 2/2009 |
| TW | 363639 U | 8/2009 |
| TW | 201008118 A | 2/2010 |
| TW | 201015412 A | 4/2010 |
| WO | 2004040240 A1 | 5/2004 |
| WO | 9743825 | 11/2007 |
| WO | 2007146780 A2 | 12/2007 |
| WO | 2009061044 A1 | 5/2009 |
| WO | 2010065207 A1 | 6/2010 |

OTHER PUBLICATIONS

Daniel Carrica et al., "Random Sampling Applied to the Measurement of a DC Signal Immersed in Noise", pp. 1319-1323, IEEE Transactions on Instrummentation and Measurement, vol. 50, No. 5, Oct. 2001.

Non-Final Office Action dated Sep. 29, 2011, U.S. Appl. No. 12/315,690, filed Dec. 5, 2008, Anthony Stephen Doy.

U.S. Appl. No. 13/934,496, Jul. 3, 2013, Joharapurkar et al.

U.S. Final Office Action dated Mar. 27, 2012, issued in U.S. Appl. No. 12/315,690.

U.S. Office Action dated Aug. 29, 2012, issued in U.S. Appl. No. 12/315,690.

U.S. Final Office Action dated Feb. 5, 2013, issued in U.S. Appl. No. 12/315,690.

U.S. Office Action dated Jun. 20, 2013, issued in U.S. Appl. No. 12/315,690.

U.S. Final Office Action dated Oct. 2, 2013, issued in U.S. Appl. No. 12/315,690.

U.S. Office Action dated Feb. 6, 2013, issued in U.S. Appl. No. 12/986,776.

U.S. Notice of Allowance dated Jul. 10, 2013, issued in U.S. Appl. No. 12/986,776.

U.S. Office Action dated Jan. 13, 2014, issued in U.S. Appl. No. 14/070,955.

U.S. Notice of Allowance dated May 2, 2014, issued in U.S. Appl. No. 14/070,955.

U.S. Office Action dated Apr. 16, 2013, issued in U.S. Appl. No. 12/986,841.

U.S. Notice of Allowance dated Sep. 4, 2013, issued in U.S. Appl. No. 12/986,841.

U.S. Notice of Allowance dated Mar. 25, 2013, issued in U.S. Appl. No. 12/986,881.

U.S. Office Action dated Nov. 19, 2014, issued in U.S. Appl. No. 13/934,496.

U.S. Final Office Action dated Mar. 18, 2015, issued in U.S. Appl. No. 13/934,496.

U.S. Notice of Allowance dated Jun. 2, 2015, issued in U.S. Appl. No. 13/934,496.

U.S. Notice of Allowance dated Sep. 24, 2015, issued in U.S. Appl. No. 13/934,496.

U.S. Notice of Allowance dated Jan. 14, 2016, issued in U.S. Appl. No. 13/934,496.

(56) References Cited

OTHER PUBLICATIONS

International Preliminary Report on Patentability and Written Opinion—PCT/US09/61359—ISA/EPO—Jun. 11, 2009.
Chinese First Office Action dated Mar. 17, 2015 issued in CN Patent Application No. 201110108196.2.
Taiwan Office Action and Search Report dated Oct. 1, 2015 issued in TW Patent Application No. TW 100109904.
Chinese First Office Action dated Mar. 27, 2015 issued in CN Patent Application No. 201110108187.3.
Taiwan Office Action dated Jun. 11, 2015 issued in TW 100109906.
Chinese First Office Action dated Mar. 27, 2015 issued in CN Patent Application No. 201110108199.6.
Taiwan Office Action dated May 27, 2015 issued in TW 1001101112.
Chinese First Office Action dated Mar. 30, 2015 issued in CN 201110108101.7.
Taiwan Office Action and Search Report dated Nov. 17, 2015 issued in TW Patent Application No. TW 100110334.
Radatz, J. The IEEE standard dictionary of electrical terms, (1996) sixth edition, pp. 196-197 and p. 544.

\* cited by examiner

USE OF RANDOM SAMPLING TECHNIQUE TO REDUCE FINGER-COUPLED NOISE

RELATED APPLICATIONS

This application claims priority under 35 U.S.C. §119(e) of the U.S. provisional patent application Ser. No. 61/326,830, filed Apr. 22, 2010, and titled "Differential Capacitive Touchpad Circuit and Method," which is hereby incorporated by reference in its entirety.

The following co-owned, co-filed, and co-pending applications, U.S. patent application Ser. No. 12/986,776, titled "Method and Apparatus for Improving Dynamic Range of a Touchscreen Controller,"; U.S. patent application Ser. No. 12/986,841, titled "System for and Method of Transferring Charge to Convert Capacitance to Voltage for Touchscreen Controllers,"; U.S. patent application Ser. No. 12/986,991, titled "System Integration of Tactile Feedback and Touchscreen Controller for Near-Zero Latency Haptics Playout,"; U.S. patent application Ser. No. 12/987,008, titled "Use of Random Sampling Technique to Reduce Finger-Coupled Noise,"; and U.S. patent application Ser. No. 12/986,905, titled "Method and Apparatus for Generating Piezoelectric Transducer Excitation Waveforms Using a Boost Converter,", are all also incorporated by reference in their entireties.

FIELD OF THE INVENTION

The present invention relates to the field of capacitive sensor arrays. More particularly, the present invention relates to the field of reducing or eliminating errors in the output of capacitive sensor arrays such as touchscreens.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A capacitive touchscreen panel is coated, partially coated, or patterned with a material that conducts a continuous electrical current across one or more capacitive touch sensors, referred to simply as touch sensors. The touch sensors exhibit a precisely controlled field of stored electrons in both the horizontal and vertical axes to achieve capacitance. The human body is also an electrical device that has stored electrons and therefore also exhibits capacitance. When a reference capacitance of the touch sensors is altered by another capacitance field, such as a finger, electronic circuits located at each corner of the panel measure the resultant distortion in the reference capacitance. The measured information related to the touch event is sent to a capacitive touchscreen controller for mathematical processing. Touch sensors can either be touched with a bare finger or with a conductive device being held by a bare hand. Touch sensors also work based on proximity, and do not have to be directly touched to be triggered. In most cases, direct contact to a conductive metal surface does not occur and the touch sensors are separated from the user's body by an insulating glass or plastic layer. Devices with capacitive buttons intended to be touched by a finger can often be triggered by quickly waving the palm of the hand close to the surface without touching.

A capacitive touchscreen is made of an array of touch sensors arranged into rows and columns. A channel can refer to either a single sensor, a row sensor, or a column sensor. In a typical capacitive touchscreen application, the capacitance of each channel is sequentially measured to generate a profile of capacitance change in the capacitive touchscreen. This capacitance profile can be used to detect the presence of a touch event and to report the position of the touch coordinates. Typically, the sampling for each channel is done at a fixed interval. However, this can form beat frequencies that are the same as certain noise frequencies.

Finger-coupled noise is the noise coupled through a finger or a conductive stylus to one or more touch sensors when the user is touching a capacitive touchscreen. Only the touch sensors beneath the finger are affected by the finger-coupled noise. The human body acts an antenna which may pick up ambient noise, such as noise generated by surrounding compact flourescent lights, which is subsequently passed to the touch sensors when touched. The human body is also grounded to the earth, which can be a different ground than the device ground of the capacitive touchscreen. With two different grounds, ground noise will also be added to the overall system. The finger-coupled noise can be of any frequency ranging from close to DC to hundred's of kilohertz (kHz) with an amplitude up to a few volts peak-to-peak. When the noise level at a particular frequency is high enough, it can cause the capacitive touchscreen controller to report a touch when no touch is actually present, referred to as a false touch.

SUMMARY OF THE INVENTION

Random sampling techniques include techniques for reducing or eliminating errors in the output of capacitive sensor arrays such as touch panels. The channels of the touch panel are periodically sampled to determine the presence of one or more touch events. Each channel is individually sampled in a round robin fashion. During each round robin, all channels are sampled once. In this manner, each round robin is referred to as a sampling cycle. Multiple sampling cycles are performed such that each channel is sampled multiple times. In some embodiments, a channel capacitance is determined for each channel by averaging the sampled values for the channel over a predetermined number of sampling cycles. In other embodiments, means other than averaging are used to calculate the channel capacitance, including but not limited to calculating a mean or a weighted average. A random sampling technique is used to sample each of the channels. Multiple different randomization techniques can be used. One random sampling technique randomizes a starting channel in each sampling cycle. Another random sampling technique randomizes the selection of all channels in each sampling cycle. Yet another random sampling technique randomizes the sampling cycle delay period between each sampling cycle. Still another random sampling technique randomizes the channel delay period between sampling each channel.

In one aspect, a method of detecting one or more touch events on a capacitive touch sensitive device is disclosed. The method includes configuring a plurality of channels, each channel corresponding to the capacitive touch sensitive device; sampling each channel in the plurality of channels according to a randomization algorithm; for each channel, calculating a channel capacitance using sampled data; and determining one or more touch events from the channel capacitances calculated for the plurality of channels. In some embodiments, the randomization algorithm comprises performing multiple sampling cycles, each sampling cycle includes sampling each channel in the plurality of channels.

In another aspect, another method of detecting one or more touch events on a capacitive touch sensitive device is disclosed. The method includes configuring a plurality of channels, each channel corresponding to the capacitive touch sensitive device; sampling each channel in the plurality of channels according to a randomization algorithm such that each channel is sampled, wherein sampling each channel comprises measuring a capacitance of each channel; performing multiple sampling cycles, wherein a sampling cycle comprises sampling each channel in the plurality of channels one time; for each channel, calculating a channel capacitance using the measured capacitances from the multiple sampling cycles for the channel; and determining one or more touch events from the channel capacitances calculated for the plurality of channels.

In some embodiments, the randomization algorithm comprises starting each sampling cycle with a randomly selected channel. In some embodiments, each channel in the plurality of channels is sampled in a predetermined sequential order, each sampling cycle starts at the randomly selected channel and sampling continues in the sequential order for a remainder of the sampling cycle. In some embodiments, the randomization algorithm further comprises randomly selecting each channel within the sampling cycle. In some embodiments, a sampling cycle delay period is included between each sampling cycle, further wherein the randomization algorithm comprises randomly changing the sampling cycle delay period between each sampling cycle. In some embodiments, a channel delay period is included between each channel sampling, further wherein the randomization algorithm comprises randomly changing the channel delay period. In some embodiments, the plurality of channels comprises N channels, and the randomization algorithm comprises randomly generating the channel delay period every M channel samples such that a same channel delay period is applied for each of M channel samples before a new channel delay period is randomly generated and applied to a next M channel samples. In some embodiments, M is less than N. In other embodiments, M is greater than N. In some embodiments, noise is distributed across a frequency response of the sampled channels. In some embodiments, noise is distributed across multiple channels in the plurality of channels. In some embodiments, calculating the channel capacitance for each channel comprises averaging the measured capacitances from the multiple sampling cycles for the channel. In some embodiments, each channel comprises either a row sensor in the capacitive touch sensitive device or a column sensor in the capacitive touch sensitive device.

In yet another aspect, an apparatus for detecting one or more touch events on a touch panel is disclosed. The apparatus includes a capacitive touch sensitive device including a plurality of channels, each channel comprising a touch sensor; a processor configured to implement a randomization algorithm; and a measuring circuit coupled to the capacitive touch sensitive device and to the processor, wherein the measuring circuit is configured to sample each channel in the plurality of channels according to the randomization algorithm, wherein the processor is configured to receive sampled data from the measuring circuit, to calculate a channel capacitance for each channel using the received sample data, and to determine one or more touch events from the channel capacitances calculated for the plurality of channels.

In some embodiments, the randomization algorithm comprises performing multiple sampling cycles, each sampling cycle includes sampling each channel in the plurality of channels. In some embodiments, the randomization algorithm further comprises starting each sampling cycle with a randomly selected channel. In some embodiments, the processor and the measuring circuit are configured such that each channel in the plurality of channels is sampled in a predetermined sequential order, each sampling cycle starts at the randomly selected channel and sampling continues in the sequential order for a remainder of the sampling cycle. In some embodiments, the randomization algorithm further comprises randomly selecting each channel within the sampling cycle. In some embodiments, a sampling cycle delay period is included between each sampling cycle, further wherein the randomization algorithm comprises randomly changing the sampling cycle delay period between each sampling cycle. In some embodiments, a channel delay period is included between each channel sampling, further wherein the randomization algorithm comprises randomly changing the channel delay period. In some embodiments, the plurality of channels comprises N channels, and the randomization algorithm comprises randomly generating the channel delay period every M channel samples such that a same channel delay period is applied for each of M channel samples before a new channel delay period is randomly generated and applied to a next M channel samples. In some embodiments, M is less than N. In other embodiments, M is greater than N. In some embodiments, the processor is configured to calculate the channel capacitance for each channel by averaging the measured capacitances from the multiple sampling cycles for the channel. In some embodiments, each channel comprises either a row sensor in the capacitive touch sensitive device or a column sensor in the capacitive touch sensitive device. In some embodiments, the capacitive touch sensitive device comprises a two-dimensional touch panel. In some embodiments, the capacitive touch sensitive device comprises a one-dimensional virtual slider.

In another aspect, another apparatus for detecting one or more touch events on a touch panel is disclosed. The apparatus includes a capacitive touch sensitive device including a plurality of channels, each channel comprising a touch sensor; a processor configured to implement a randomization algorithm; and a measuring circuit coupled to the capacitive touch sensitive device and to the processor, wherein the measuring circuit is configured to sample each channel in the plurality of channels according to the randomization algorithm such that each channel is sampled, wherein sampling each channel comprises measuring a capacitance of each channel, and multiple sampling cycles are performed, wherein a sampling cycle comprises sampling each channel in the plurality of channels one time, wherein the processor is configured to receive measured capacitance data from the multiple sampling cycles, to calculate a channel capacitance for each channel using the received measured capacitance data, and to determine one or more touch events from the channel capacitances calculated for the plurality of channels.

BRIEF DESCRIPTION OF THE DRAWINGS

The accompanying drawings, which are incorporated in and form a part of this specification, illustrate embodiments of the differential sensing scheme and, together with the description, serve to explain the principles of the haptic feedback system, but not limit the invention to the disclosed examples.

DETAILED DESCRIPTION OF THE EMBODIMENTS

Figure 1:
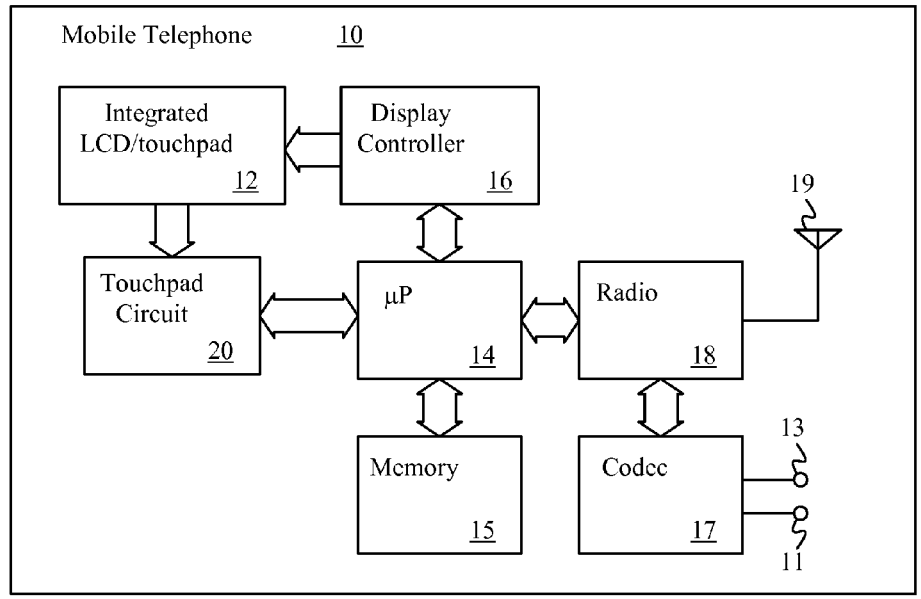
FIG. 1 illustrates a block diagram of an exemplary application using the random sampling techniques.

Embodiments of the present invention are directed to random sampling techniques to reduce noise in a capacitive touchscreen. Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

While the random sampling techniques will be described in conjunction with the embodiments below, it will be understood that they are not intended to limit the methods and systems of these embodiments and examples. On the contrary, the random sampling techniques are intended to cover alternatives, modifications and equivalents, which may be included within the spirit and scope of the present invention as defined by the appended claims. Furthermore, in the following detailed description, numerous specific details are set forth in order to more fully illustrate the methods and systems. However, it will be apparent to one of ordinary skill in the prior art that the methods and systems may be practiced without these specific details.

In accordance with the present application, some of the components, process steps, and/or data structures may be implemented using various types of processing systems, including hardware, software, or any combination thereof. In addition, those of ordinary skill in the art will recognize that devices of a less general purpose nature, such as hardwired devices, application specific integrated circuits (ASICs), or the like, may also be used without departing from the scope and spirit of the inventive concepts disclosed herein.

Random sampling techniques include techniques for reducing or eliminating errors in the output of capacitive sensor arrays such as touchpads, touchscreens, touch sliders and the like, including touch sensors that detect the presence and position of a stylus, as well as those that detect and determine finger position. As used herein, reference to a finger, a touch, a touch event, or the like refers to a user making contact, or proximate contact as applicable, to the touchscreen or touch panel by a user's finger or conductive device held by the user, such as a conductive stylus. The random sampling techniques describe means of extracting a touch event related signal in the presence of extraneous signals. In particular, the random sampling techniques describe methods of spreading out or reducing any noise, such as finger-coupled noise, present at a dominant frequency to a level that does not cause a false touch. The random sampling techniques randomize the interval at which each sensor channel is sampled. In some embodiments, the randomization is achieved by randomizing the sampling order of the channels. In other embodiments, the randomization is achieved by inserting a random delay between successive channel sampling. While the illustrative embodiment described herein is applied in a mobile telephone, it is understood that capacitive touch sensors are used in a wide variety of devices. Examples of such devices include, but are not limited to, portable devices, such as personal digital assistants (PDAs), global positioning systems (GPS) receivers, as well as larger devices such as touchscreen enabled displays and computer systems, as well as appliances.

FIG. 1 illustrates a block diagram of an exemplary application using the random sampling techniques. A mobile telephone 10 includes a microprocessor 14 coupled to a memory 15 that stores program instructions for execution by microprocessor 14, and generally includes non-volatile storage for such program instructions, as well as temporary storage for use by microprocessor 14. The program instructions stored in memory 15 include program instructions forming computer program products in accordance with embodiments of the present invention that determine the position of one or more fingers and/or styli at the surface of a touch sensor array included in an integrated liquid crystal display (LCD)/touchpad 12. The LCD/touchpad 12 is coupled to a touchpad circuit 20 in accordance with an embodiment of the present invention that includes the capability of measuring the capacitance of the touch sensitive channels of the touchpad within LCD/touchpad 12. The mobile telephone 10 also includes a display controller 16 for coupling microprocessor 14 to the LCD within integrated LCD/touchpad 12 and radio circuits 18 for providing wireless telephone connections. Mobile telephone 10 also includes an audio codec 17 coupled to a microphone 13 and a speaker element 11 that provide for voice communications with a user.

Each touch sensor in the touchpad measures a change in capacitance. The touchpad circuit 20 converts the sensed capacitance change to a voltage. Noise present in the system can alter the change in capacitance perceived by the capacitive touch sensors, making it indistinguishable from a real touch event. Finger-coupled noise can cause the touchpad circuit 20 to report false touches.

Figure 2:
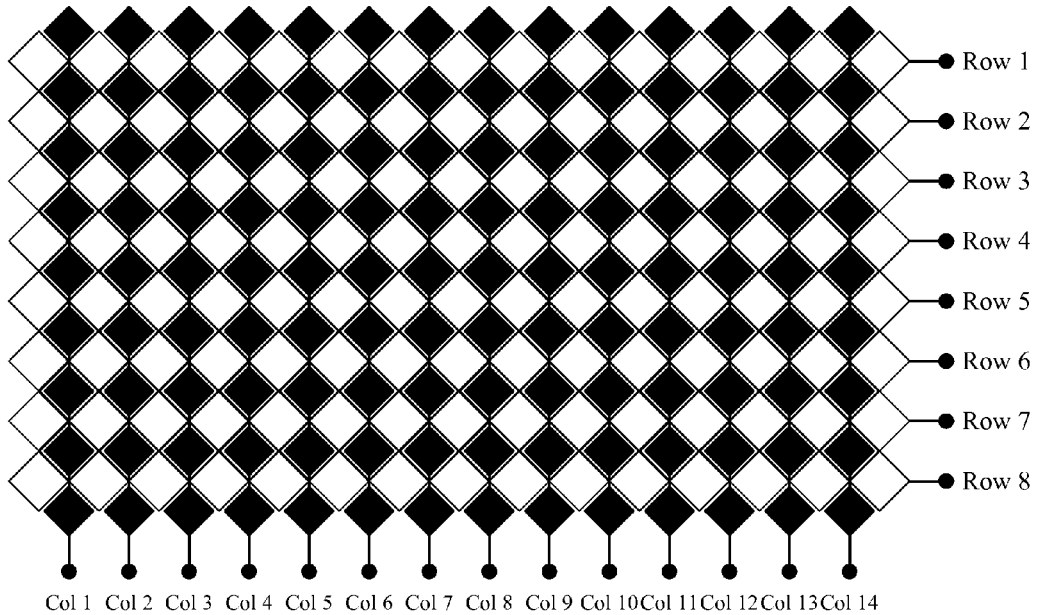
FIG. 2 illustrates an exemplary touch panel used as a capacitance touch interface.

FIG. 2 illustrates an exemplary array of capacitive touch sensors, referred to collectively as a touch panel, used as a capacitance touch interface. The touch sensors are configured into rows and columns. The white diamonds are the row touch sensors and the shaded diamonds are the column touch sensors. All white diamonds in a given row, for example the 15 white diamonds in row 1, are serially connected via bridges to form one single row sensor. Similarly, all black diamonds in a given column are serially connected to form one single column sensor. In the exemplary configuration of FIG. 2, the touch panel includes 8 row sensors and 14 column sensors. As used herein, a channel refers to a single touch sensor, a row sensor, or a column sensor. Referring to the touch panel of FIG. 2, each row sensor and each column sensor are referred to as channels. In this exemplary case having 8 row sensors and 14 column sensors, there are a total of 22 channels.

When a finger or a conductive stylus approaches the touch panel, at the area where the touch panel is contacted, the channel capacitance changes, or in the case of the two-dimensional array of touch sensors in FIG. 2, the capacitance of a row sensor and column sensor changes. An analog front end (AFE) circuit converts the capacitance detected by the channel to a proportional voltage. In some embodiments, the touchpad circuit 20 and the AFE circuits are configured as capacitance measuring circuits. In other embodiments, the AFE circuit is alternatively configured so that the differential sensing scheme can be used. The AFE outputs the converted voltage to an analog-to-digital converter (ADC), which coverts the voltage to a digital code representation. The noise sources can change the output of the AFE. In the absence of incident noise, a normal touch causes the ADC output to be changed by a few hundred codes. However, in the presence of incident noise, an un-touched sensor can also cause the ADC output to be changed by a few hundred codes. In this case, the touchpad circuit 20 can not distinguish between an actual touch versus a non-touch with noise coupling. Any conventional touch sensing circuitry can be used to measure and determine the capacitance and capacitance changes of each channel. In a preferred embodiment, the capacitance and capacitance changes are measured and determined using the sensing circuits and methods described in the co-pending U.S. patent application Ser. No. 12/986,841, titled "Charge Transfer Scheme to Convert Capacitance to Voltage for Touchscreen Controller,".

The channels of the touch panel are periodically sampled to determine the presence of one or more touch events. All channels are not continuously and simultaneously sampled so as to minimize power and processing requirements. Instead, each channel is individually sampled in a round robin fashion. During each round robin, all channels are sampled once. In this manner, each round robin is referred to as a sampling cycle. Multiple sampling cycles are performed such that each channel is sampled multiple times. A channel capacitance is determined for each channel by averaging the sampled values for the channel over a predetermined number of sampling cycles. Channel capacitance is calculated by averaging to reduce the influence of noise.

Figure 3:
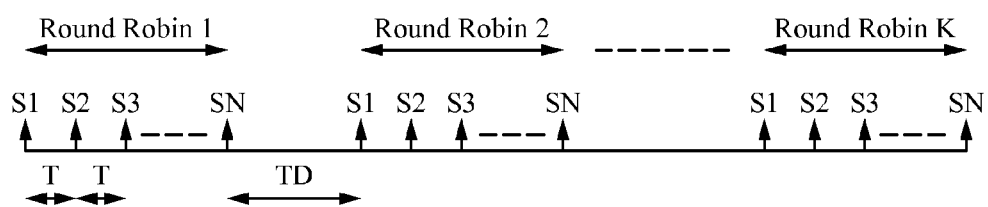
FIG. 3 illustrates a non-random sampling technique for sampling the channels of a touch panel.

FIG. 3 illustrates a non-random sampling technique for sampling the channels of a touch panel. There are N number of channels, for example 22 channels as in the touch panel of FIG. 2 having 14 columns and 8 rows. The channels are sampled sequentially, starting from channel 1 and ending with channel N, where the sampled channel 1 is designated by S1, sampled channel 2 is designated by S2, sampled channel 3 is designated by S3 and so on to sampled channel N designated by SN. There is a channel delay period T between sampling of each channel. Each round robin, or sampling cycle, is delayed by a sampling cycle delay period TD. The capacitance of each channel is periodically determined by averaging the sampled values for each channel over K number of sampling periods. For example, the channel capacitance for channel 1 is calculated using the sample value S1 from sampling cycle 1 (round robin 1), sample value S1 from sampling cycle 2 (round robin 2), and so on for each sample value S1 from the remaining sampling cycles up to sampling cycle K (round robin K). The actual values used in this calculation are converted voltages, codes, or other representations of the original data sensed by the sampled channel.

Figure 4:
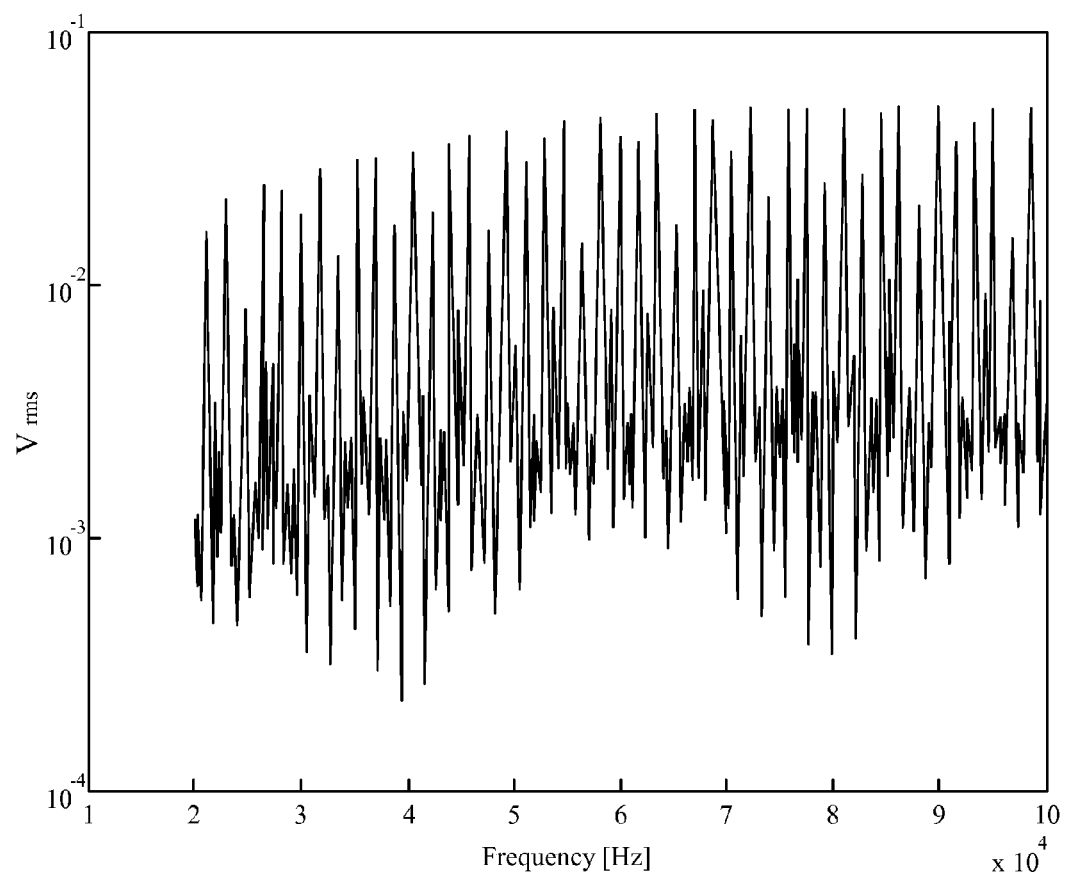
FIG. 4 illustrates an exemplary frequency response using the non-random sampling technique.

In this non-random sampling technique, every channel is sampled according to a fixed time period defined by (N−1)*T+TD. This constant sampling period forms beat frequencies. The frequency response associated with sampling the touch panel using the non-random sampling technique shows spikes at the beat frequencies. Touch detection is susceptible to noise at the beat frequencies as sampling of the touch event is performed at the same beat frequencies. FIG. 4 illustrates an exemplary frequency response corresponding to a touch event using the non-random sampling technique. The spikes in the frequency response shown in FIG. 4 show the effects of the beat frequencies. Taking an average typically reduces noise by a factor of the square root of the number of averages. But, if there is a fixed frequency relationship between the noise and the sampling period, averaging does not reduce the noise. If noise has the same frequency as the beat frequency, then averaging the sampled values over K sampling cycles does not effect the noise spikes as each sample has the same noise. The same noise is sampled again and again since the noise and the sampling rate have the same frequency.

The noise spikes seen in the non-random sampling technique can be alleviated by randomizing the time interval at which the samples are taken for each channel. Instead of sampling at beat frequencies that leads to systematic noise, sampling is randomized so that taking averages results in spreading the noise across multiple frequencies. The end result using randomization is that even if noise is present at a certain frequency or frequency span, the noise is spread across other frequencies, thereby reducing the peak noise. Using the non-random sampling technique, if a peak noise is present at a certain frequency which is the same frequency as or a multiple of a beat frequency, then the peak noise is not reduced by taking averages. However, the random sampling techniques do lead to a reduced peak noise. Multiple different randomization techniques can be used.

Figure 5:
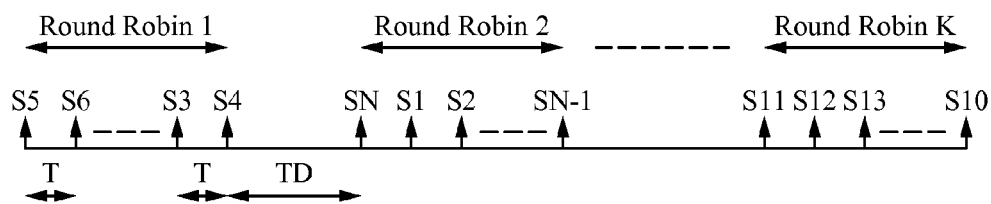
FIG. 5 illustrates a first random sampling technique for sampling the channels of a touch panel.

FIG. 5 illustrates a first random sampling technique for sampling the channels of a touch panel. The first random sampling technique randomizes a starting channel in each sampling cycle. In other words, each sampling cycle is started with a random channel. In some embodiments, a random number generator is used to generate the number of the starting channel for each sampling cycle. Alternatively, any conventional method for generating a random starting number can be used. All N channels are sequentially sampled, starting with the randomly selected starting channel. Within each sampling cycle, the sampling sequence loops back to channel 1 after sampling channel N in order to sample all channels during the sampling cycle. As shown in the exemplary sequence of FIG. 5, the first sampling cycle (round robin 1) starts with the randomly selected channel 5, followed by channel 6 and so on until channel N, followed by channel 1, then channel 2 and so on until finishing the first sampling cycle with channel 4. Sampling of each channel is delayed by the channel delay period T. Each sampling cycle is delayed by the sampling cycle delay period TD. The second sampling cycle (round robin 2) starts with the randomly selected channel N, followed by channel 1 and so on until finishing the second sampling cycle with channel N−1. The last sampling cycle K (round robin K) starts with the randomly selected channel 11, followed by channel 12 and so on until finishing the last sampling cycle with channel 10. The capacitance, or representative value, of each channel is periodically determined by averaging the sampled values for each channel over the K sampling cycles. Since the channels are not sampled in the same absolute order from one switching cycle to the next, the processor must rearrange the sample order to perform the average calculation. For example, channel 1 may be the first channel sampled in a given sampling cycle, but channel 1 is not always sampled as the first channel in all sampling cycles. As such, the channel 1 samples must be matched together from different sampling positions within the different sampling cycles in order to be properly averaged. This rearranging requires additional processing.

Figure 6:
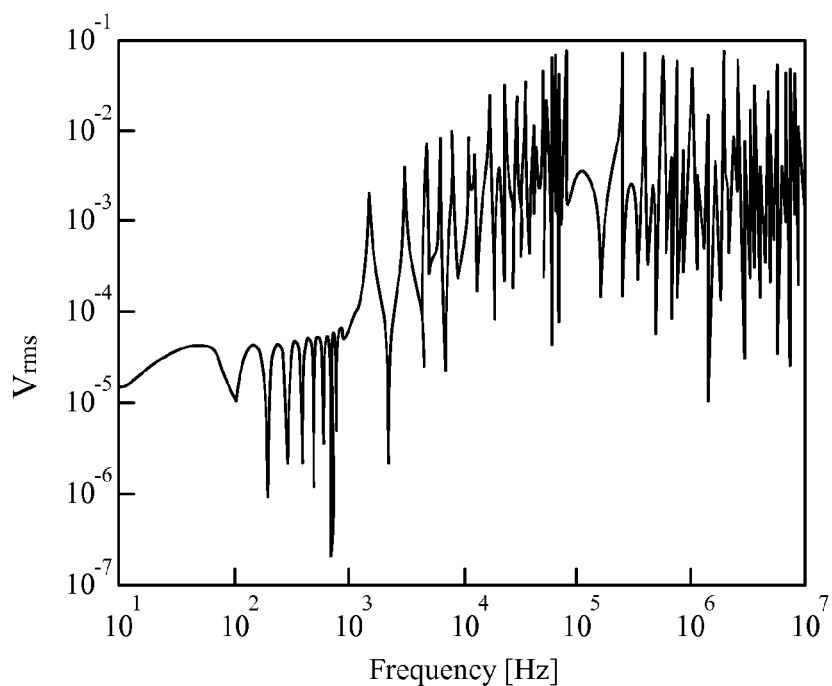
FIG. 6 illustrates an exemplary frequency response using the non-random sampling technique.
Figure 7:
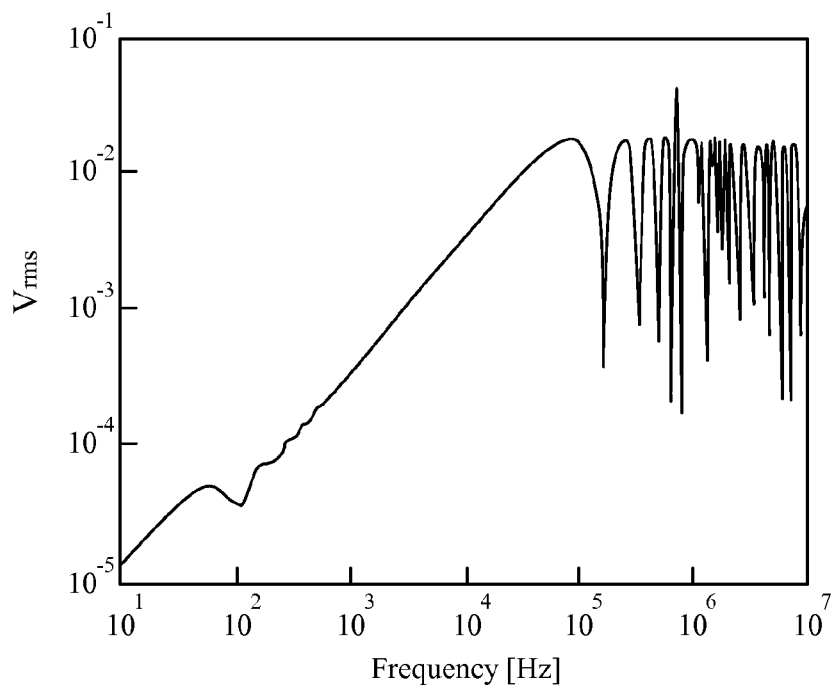
FIG. 7 illustrates a comparable frequency response to FIG. 6 except that the first random sampling technique is applied.

FIG. 6 illustrates an exemplary frequency response using the non-random sampling technique. FIG. 7 illustrates a comparable frequency response to FIG. 6 except that the first random sampling technique is applied. FIG. 6 shows the noise spurs present on the beat frequencies. FIG. 7 shows a reduction in the noise spurs resulting from the first random sampling technique.

In an alternative embodiment, the first random sampling technique is modified so that each channel is randomly selected, not just the starting channel. In this modified technique, each sample is selected once and at random during each sampling cycle.

Figure 8:
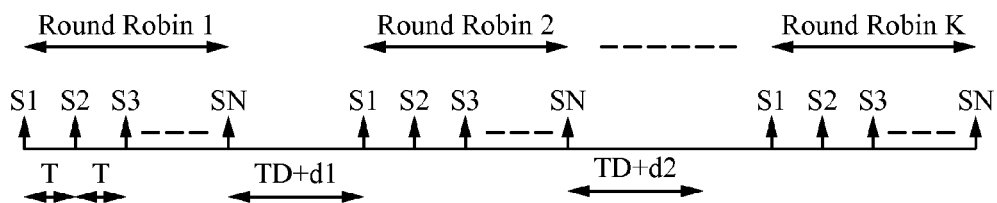
FIG. 8 illustrates a second random sampling technique for sampling the channels of a touch panel.

FIG. 8 illustrates a second random sampling technique for sampling the channels of a touch panel. The second random sampling technique randomizes the sampling cycle delay period between each sampling cycle. In the second random sampling technique, the sampling order of the channels remains constant from sampling cycle to sampling cycle. As shown in the exemplary sequence of FIG. 8, channel 1 is always sampled first. It is understood that any channel can be selected as the first sampled channel, as long as this channel remains the first sampled channel for all sampling cycles. All N channels are sequentially sampled, starting with the first sampled channel, such as channel 1. In some embodiments, a random number generator is used to generate the channel delay period between each sampling cycle. Alternatively, any conventional method for generating a random starting number can be used.

Sampling of each channel is delayed by the channel delay period T. Each sampling cycle is delayed by the sampling cycle delay period, represented as some fixed period TD plus a randomly generated delay dX. As shown in FIG. 8, the sampling cycle delay period between the first sampling cycle (round robin 1) and the second sampling cycle (round robin 2) is TD+d1, and the sampling cycle delay period between the second sampling cycle and the third sampling cycle (not shown) is TD+d2. The size and range of the random delay dX is programmable so as to meet a desired level of randomization. In some embodiments, the size of the random delay dX is set to be within 10% of the fixed period TD. For each specific touch panel implementation, the programmable value may vary. The capacitance, or representative value, of each channel is periodically determined by averaging the sampled values for each channel over the K sampling cycles. Since the sampling order is the same between each sampling cycle, no additional processing is required to rearrange the channel samples prior to averaging.

Figure 9:
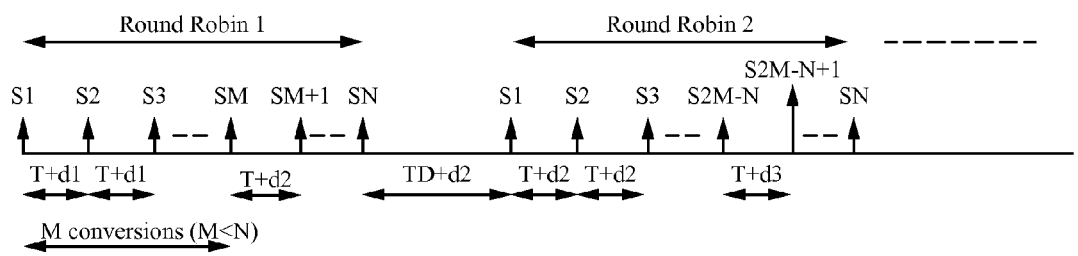
FIG. 9 illustrates a third random sampling technique for sampling the channels of a touch panel.

FIG. 9 illustrates a third random sampling technique for sampling the channels of a touch panel. The third random sampling technique randomizes the channel delay period between sampling each channel. In the third random sampling technique, the sampling order of the channels remains constant from sampling cycle (round robin) to sampling cycle. As shown in the exemplary sequence of FIG. 9, channel 1 is always sampled first. It is understood that any channel can be selected as the first sampled channel, as long as this channel remains the first sampled channel for all sampling cycles. All N channels are sequentially sampled, starting with the first sampled channel, such as channel 1. In some embodiments, a random number generator is used to generate the channel delay period between each sampling cycle. Alternatively, any conventional method for generating a random starting number can be used.

Sampling of each channel is delayed by the channel delay period, represented as some fixed period T plus a randomly generated delay dX. Each sampling cycle is delayed by the sampling cycle delay period, represented as some fixed period TD plus the randomly generated delay dX. The random delay dX is changed after every M channels are sampled. In the third random sampling technique, M is less than the number of channels N. As shown in FIG. 9, the random delay d1 is applied for the first M channels. The random delay d2 is applied to the next M channels, which includes channel M+1 to channel N in the sampling cycle 1 (round robin 1) and channel 1 to channel 2M−N in the sampling cycle 2 (round robin 2). The random delay d2 applied between the channel M in the sampling cycle 1 to the channel 2M−N in the sampling cycle 2 is added to the fixed portion TD of the sampling cycle delay period. It is understood that the sizes of the random delays d1 and d2 in the third random sampling technique may or may not be the same as the sizes of the random delays d1 and d2 in the second random sampling technique. In some embodiments, the sizes of the random delays d1 and d2 in the third random sampling technique are smaller than the sizes of the random delays d1 and d2 in the second random sampling technique. The size and range of the random delay dX is programmable so as to meet a desired level of randomization. The capacitance, or representative value, of each channel is periodically determined by averaging the sampled values for each channel over the K sampling cycles. Since the sampling order is the same between each sampling cycle, no additional processing is required to rearrange the channel samples prior to averaging.

Figure 10:
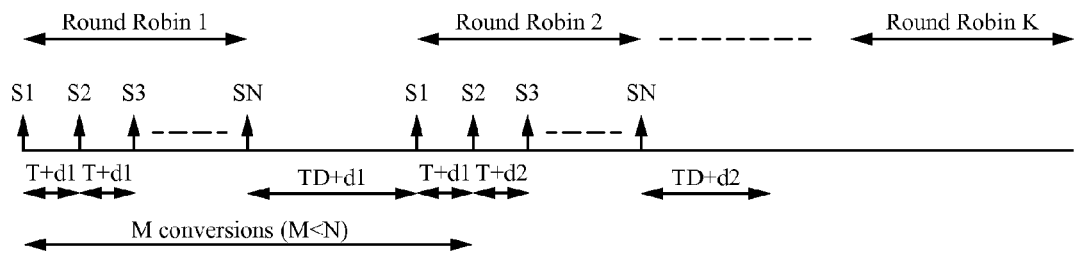
FIG. 10 illustrates a fourth random sampling technique for sampling the channels of a touch panel.

FIG. 10 illustrates a fourth random sampling technique for sampling the channels of a touch panel. The fourth random sampling technique is the same as the third random sampling technique except that M is greater than the number of channels N.

Figure 11:
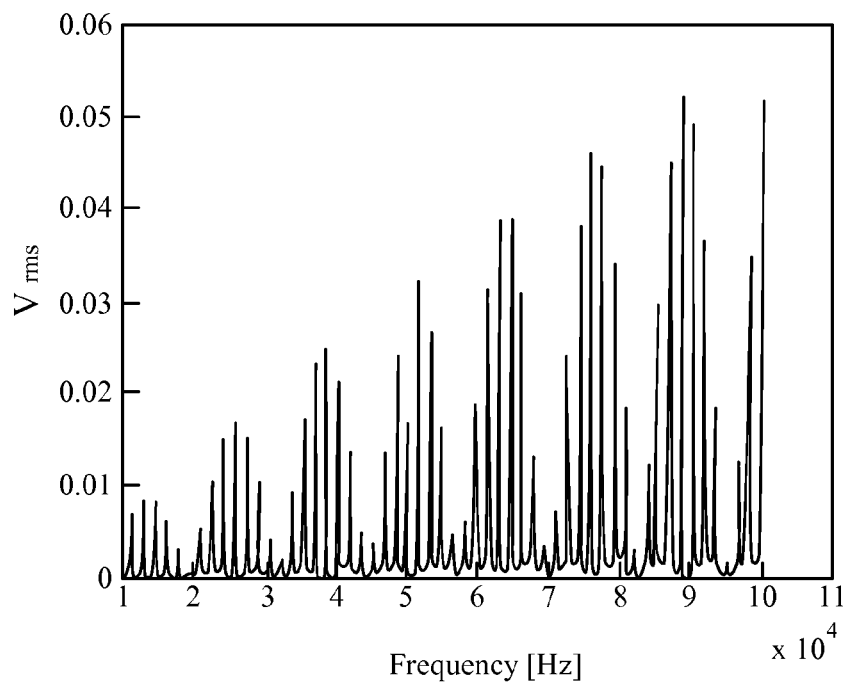
FIG. 11 illustrates an exemplary frequency response using the non-random sampling technique.
Figure 12:
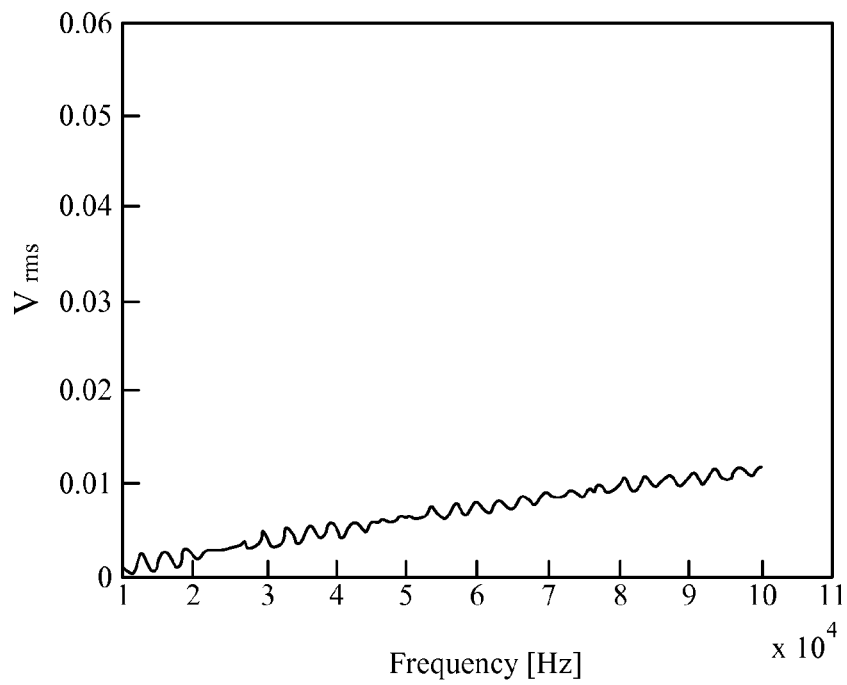
FIG. 12 illustrates a comparable frequency response to FIG. 11 except that the third or fourth random sampling technique are applied.

FIG. 11 illustrates an exemplary frequency response using the non-random sampling technique. FIG. 12 illustrates a comparable frequency response to FIG. 11 except that the third or fourth random sampling technique are applied. FIG. 11 shows the noise spurs present on the beat frequencies. FIG. 12 shows a reduction in the noise spurs resulting from the third or fourth random sampling technique. Similar results as that shown in FIG. 12 are seen using the second random sampling technique.

The random sampling techniques are described above in the context of a two-dimensional array of touch sensors, such as the touch panel of FIG. 2. The random sampling techniques can also be applied to a one-dimensional array of touch sensors, where each individual touch sensor is measured, as opposed to a row or column of touch sensors. An example of such a one-dimensional application is applying the random sampling technique to virtual sliders and scroll wheels.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A method of detecting one or more touch events on a capacitive touch sensitive device comprising:
   configuring a plurality of channels, each channel corresponding to the capacitive touch sensitive device;
   sampling each channel in the plurality of channels according to a randomization algorithm during a first sampling cycle, wherein a randomly selected channel is sampled at a start of the first sampling cycle according to the randomization algorithm, wherein each channel in the plurality of channels is sampled after a defined channel delay period;
   sampling, after a defined first sampling cycle delay period between the first sampling cycle and a second sampling cycle, each channel in the plurality of channels according to the randomization algorithm during the second sampling cycle, wherein a randomly selected channel is sampled at a start of the second sampling cycle according to the randomization algorithm, wherein each channel in the plurality of channels is sampled after the defined channel delay period, wherein the defined first sampling cycle delay period is greater than the defined channel delay period;
   sampling, after a defined second sampling cycle delay period between the second sampling cycle and a third sampling cycle, each channel in the plurality of channels according to the randomization algorithm during the third sampling cycle, wherein a randomly selected channel is sampled at a start of the third sampling cycle according to the randomization algorithm, wherein each channel in the plurality of channels is sampled after the defined channel delay period, wherein the defined second sampling cycle delay period is greater than the defined channel delay period, wherein the defined second sampling cycle delay period is equal to the defined first sampling cycle period;
   matching sampled data sampled during the first sampling cycle for each channel of the plurality of channels to the sampled data sampled during the second sampling cycle and the third sampling cycle for the same channel;
   for each channel, calculating a channel capacitance using sampled data, wherein calculating the channel capacitance for each channel comprises averaging the sampled data for each channel over multiple cycles; and
   determining one or more touch events based upon the channel capacitances calculated for the plurality of channels, wherein each channel in the plurality of channels is sampled in a sequential order during the first sampling cycle, the second sampling cycle, and the third sampling cycle.

2. The method of claim 1 wherein each channel comprises either a row of touch sensors in the capacitive touch sensitive device or a column of touch sensors in the capacitive touch sensitive device.

3. The method of claim 1 wherein noise is distributed across a frequency response of the sampled channels.

4. A method of detecting one or more touch events on a capacitive touch sensitive device comprising:
   configuring a plurality of channels, each channel corresponding to the capacitive touch sensitive device;
   sampling each channel in the plurality of channels according to a randomization algorithm such that each channel is sampled, wherein sampling each channel comprises measuring a capacitance of each channel;
   performing a first sampling cycle, wherein the first sampling cycle comprises sampling each channel in the plurality of channels, wherein a randomly selected channel is sampled at a start of the first sampling cycle according to the randomization algorithm, wherein each channel in the plurality of channels is sampled after a defined channel delay period;
   performing a second sampling cycle after a defined sampling cycle delay period, wherein the second sampling cycle comprises sampling each channel in the plurality of channels, wherein a randomly selected channel is sampled at a start of the second sampling cycle according to the randomization algorithm, wherein each channel in the plurality of channels is sampled after the defined channel delay period, wherein the defined sampling cycle delay period is greater than the channel delay period;
   matching sampled data sampled during the first sampling cycle for each channel of the plurality of channels sampled to the sampled data sampled during the second sampling cycle for the same channel;
   for each channel, calculating a channel capacitance using the measured capacitances from multiple sampling cycles for the channel; and
   determining one or more touch events from the channel capacitances calculated for the plurality of channels;
   wherein:
   each channel in the plurality of channels is sampled in a predetermined sequential order, each sampling cycle starts at the randomly selected channel and sampling continues in the sequential order for a remainder of the sampling cycle.

5. The method of claim 4 wherein noise is distributed across a frequency response of the sampled channels.

6. The method of claim 4 wherein each channel comprises either a row sensor in the capacitive touch sensitive device or a column sensor in the capacitive touch sensitive device.

7. An apparatus for detecting one or more touch events on a touch panel comprising:
   a capacitive touch sensitive device including a plurality of channels, each channel comprising a touch sensor;
   a processor configured to implement a randomization algorithm; and
   a measuring circuit coupled to the capacitive touch sensitive device and to the processor, wherein the measuring circuit is configured to sample each channel in the plurality of channels during a first sampling cycle according to the randomization algorithm and to sample each channel in the plurality of channels during a second sampling cycle after a defined sampling cycle delay period according to the randomization algorithm, wherein each channel in the plurality of channels is sampled after a defined channel delay period, wherein the defined sampling cycle delay period is greater than the defined channel delay period, wherein a randomly selected channel is sampled at a start of each sampling cycle according to the randomization algorithm, wherein the processor is configured to receive sampled data from the measuring circuit, to match sampled data sampled during a first sampling cycle for each channel of the plurality of channels to the sampled data sampled during a second sampling cycle for the same channel, to calculate a channel capacitance for each channel using the received sample data, and to determine one or more touch events from the channel capacitances calculated for the plurality of channels, wherein the processor is configured to calculate the channel capacitance for each channel by averaging the sampled data for each channel over multiple cycles; wherein each channel in the plurality of channels is sampled in a predetermined sequential order, each sampling cycle starts at the randomly selected channel and sampling continues in the sequential order for a remainder of the sampling cycle.

8. The apparatus of claim 7 wherein each channel comprises either a row sensor in the capacitive touch sensitive device or a column sensor in the capacitive touch sensitive device.

9. The apparatus of claim 7 wherein the capacitive touch sensitive device comprises a two- dimensional touch panel.

10. The apparatus of claim 7 wherein the capacitive touch sensitive device comprises a one-dimensional virtual slider.

11. An apparatus for detecting one or more touch events on a touch panel comprising:
   a capacitive touch sensitive device including a plurality of channels, each channel comprising a touch sensor;
   a processor configured to implement a randomization algorithm; and
   a measuring circuit coupled to the capacitive touch sensitive device and to the processor, wherein the measuring circuit is configured to sample each channel in the plurality of channels during a first sampling cycle according to the randomization algorithm such that each channel is sampled and to sample each channel in the plurality of channels during second sampling cycle after a defined sampling cycle delay period according to the randomization algorithm such that each channel is sampled, wherein a randomly selected channel is sampled at a start of each sampling cycle according to the randomization algorithm, wherein each channel in the plurality of channels is sampled after a defined channel delay period, wherein the defined sampling cycle delay period is greater than the defined channel delay period, wherein sampling each channel comprises measuring a capacitance of each channel, and multiple sampling cycles are performed, wherein a sampling cycle comprises sampling each channel in the plurality of channels one time, wherein the processor is configured to receive measured capacitance data from the multiple sampling cycles, to match sampled data sampled during a first sampling cycle for each channel of the plurality of channels to the sampled data sampled during a second sampling cycle for the same channel, to calculate a channel capacitance for each channel using the received measured capacitance data, and to determine one or more touch events from the channel capacitances calculated for the plurality of channels, wherein the processor is configured to calculate the channel capacitance for each channel by averaging the sampled data for each channel over multiple cycles; wherein:

each channel in the plurality of channels is sampled in a predetermined sequential order, each sampling cycle starts at the randomly selected channel and sampling continues in the sequential order for a remainder of the sampling cycle.

\* \* \* \* \*